(12) United States Patent
Segal et al.

(10) Patent No.: US 6,745,370 B1
(45) Date of Patent: Jun. 1, 2004

(54) METHOD FOR SELECTING AN OPTIMAL LEVEL OF REDUNDANCY IN THE DESIGN OF MEMORIES

(75) Inventors: Julie Segal, Palo Alto, CA (US); David Lepejian, Palo Alto, CA (US); John Caywood, Sunnyvale, CA (US)

(73) Assignee: Heuristics Physics Laboratories, Inc., San Jose, CA (US)

( * ) Notice: Subject to any disclaimer, the term of this patent is extended or adjusted under 35 U.S.C. 154(b) by 330 days.

(21) Appl. No.: 09/616,806

(22) Filed: Jul. 14, 2000

(51) Int. Cl.$^7$ .......................... G06F 17/50; G01R 31/28

(52) U.S. Cl. ................... 716/2; 716/4; 716/1; 714/724; 714/732

(58) Field of Search ..................... 716/2, 1, 4; 714/732, 714/724

(56) References Cited

U.S. PATENT DOCUMENTS 5,269,014 A * 12/1993 Ogino .......................... 703/22
5,475,695 A * 12/1995 Caywood et al. ........... 714/738
6,185,707 B1 * 2/2001 Smith et al. ................ 714/724

OTHER PUBLICATIONS

D.Y. Lepejian et al., An Automated Failure Analysis Methodology for Repeated Structures, 12$^{th}$ IEEE VLSI Test Symposium, pp. 319–324, Apr. 1994.*
J. Segal et al., Using Electrical Bitmap Results from Embedded Memory to Enhance Yield, IEEE Design & Test of Computers, pp. 28–39, May 2001.*
J. Segal et al., Critical Area Based Yield Prediction Using In–Line Defect Classification Information, 2000 IEEE SEMI Advanced Semiconductor Manufacturing Conference and Workshop, pp. 83–88, Sep. 2000.*
A. Jee et al., Carafe: An Inductive Fault Analysis Tool for CMOS VLSI Circuits, 11$^{th}$ Annual 1993 IEEE VLSI Test Symposium, pp. 92–98, Apr. 1993.*
J. Segal et al, "Determining Redundancy Requirements for Memory Arrays with Critical Area Analysis", *Proceedings of the 1999 IEEE International Workshop on Memory Technology, Design, and Testing*, IEEE Comput. Soc., Aug. 1999.
J. Segal et al., "A Framework for Extracting Defect Density Information for Yield Modeling from In–line Defect Inspection for Real–time Prediction of Random Defect Limited Yields", *Proceedings of the 1999 IEEE International Symposium on Semiconductor Manufacturing*, (Piscataway, NJ: Institute of Electrical and Electronics Engineers), pp. 403–406. 1999 (no month).
J. Segal, T. Ho, B. Hodgkins, P. Misic, J. Lin, M. Yegnashankaran, "Predicting Failing Bitmap Signatures with Critical Area Analysis", *1999 Proceedings IEEE/SEMI Advanced Semiconductor Manufacturing Conference and Workshop (ASMC)*, pp. 178–182.

* cited by examiner

*Primary Examiner*—A. M. Thompson
(74) *Attorney, Agent, or Firm*—Sierra Patent Group, Ltd.

(57) ABSTRACT

A method for determining the number of redundancy units to employ in a memory integrated circuit. The critical areas for faults on each process layer in the integrated circuit for a range of defect sizes, and the signatures of the electrical responses of faulted circuits to input test stimuli are determined. A statistical frequency distribution for both the signatures for a ratio of defect sizes on each of the process layers, and for the occurrences of selected combinations of the signatures are determined. A ratio of the signature distribution for different numbers of redundancy units, and the die area for each of the different numbers of redundancy units are determined. The number of usable die per wafer is determined from the signature distribution and the die area. A level of redundancy that maximizes the number of usable die per wafer is selected.

8 Claims, 5 Drawing Sheets

METHOD FOR SELECTING AN OPTIMAL LEVEL OF REDUNDANCY IN THE DESIGN OF MEMORIES

BACKGROUND OF THE INVENTION

1. Field of the Invention

The present invention relates to yield improvement in integrated circuits and in particular, yield improvement in integrated circuit memory. More particularly, the present invention relates to improvements in the use of redundancy in memory arrays.

2. The Prior Art

The electrical test yield of an integrated circuit memory can be dramatically improved by the use of redundant rows and/or columns of cells that can be used in a memory in the place of a row or a column containing failing bits for the case in which the electrical test yield is limited by localized manufacturing defects. The use of redundancy in memories is well known and has been employed for many years.

As is well known, not all faults (i.e. alterations in circuit behavior) are repairable. Specifically, faults resulting from device parametric changes that affect large areas or faults that affect the chip globally such as shorts between traces that connect to power supplies with differing potential are not repairable.

A critical issue is the amount of redundancy to be incorporated in the design. It is desirable to have enough redundancy to repair most of the repairable faults. However, as more redundancy is incorporated, the area of each integrated circuit grows so that the number of dice that will fit onto a wafer decreases. Thus, beyond some level of redundancy, the number of gross dice on a wafer decrease faster than the number of dice repaired by the additional redundancy increase so that the net number of good dice after redundancy repair decreases. The goal is to choose the amount of redundancy to maximize the number of usable dice produced per wafer.

There are many repair schemes possible to employ the redundancy that is built into a part, especially if both row and column redundancy are available. For example, first all of the row redundancy could be used; then, if there are still unrepaired faults, the column redundancy would be used until either all faults were repaired or all of the redundancy was used up. Alternatively, the redundant row and columns would be employed in an alternate fashion, first a redundant row and then a redundant column, until either all faults are repaired or all available redundant cells are used. Some procedures, or algorithms, are more efficient than others, on the average, in the use of the redundant resources so that with a given level of resources, a higher fraction of the dice on a wafer are repaired.

SUMMARY OF THE INVENTION

The focus of the present invention is predicting the level of redundancy that will yield the highest number of usable (i.e. good plus repairable) dice per wafer prior to completion of the memory design so that the optimum redundancy can be designed into the product.

This invention begins by analyzing the chip layout layer by layer to identifying the regions in which a defect can cause a fault, i.e. an alteration of the circuit topology, and the relative likelihood that each fault will occur for a defect of a given size. (Each layer may be thought of as a conducting layer that may be incorrectly linked to another conductor to form a bridge fault or incorrectly broken to form a break fault.)

Once the faults are identified, the electrical output responses to a set of input stimuli are found. The responses to each fault is called a signature. In general, several faults may have the same signature. Examples of signatures are a failing row, a failing column, a single bit failure, etc.

The faults for each defect size on each layer are weighted by the relative probabilities of the defect sizes. It is commonly found that the probability of the defect sizes is proportional to $\lambda^{-3}$ where $\lambda$ is the diameter of the defect, but other weightings can be used if it is found that they better describe the distribution for a given technology. The weighted fault distributions are summed over defect sizes and process layers to arrive at a single distribution of signatures representing the probabilities of the signatures occurring taking into account defects of all sizes occurring on all process layers. This distribution is stored for use in later calculations.

Of course, more than one signature can occur on a single die. This requires that the signature distribution be used to calculate the probability of various combinations of signatures. For each combination of signatures, the redundancy algorithm is applied to find the number of redundant elements required to repair that combination. Since the probability of each combination is known, the fraction of the defect combinations that can be repaired for each level of redundancy is determined, which determines the fraction of the available dice that are usable for each level of redundancy.

Separately, the area penalty to the die for various levels of redundancy can be estimated. Typically, there is a fixed area cost for the implementation of any redundancy plus a term that increase with the level of redundancy. The fixed term arises from the overhead of the circuitry required to implement redundancy. The variable area comes from the extra rows and/or columns inserted to provide the redundant memory cells and the growth in the size of the redundancy circuitry as more redundancy is included. Once the area penalty for redundancy is estimated, the total number of dice on each wafer can be calculated as a function of the level of redundancy.

Combining the number of available dice per wafer with the fraction of available dice that are usable provides a prediction of the number of usable dice per wafer. The level of redundancy is chosen to maximize this number.

An additional benefit can be gained from the procedure outlined in this invention is that with a small variation, the redundancy repair algorithm can also be optimized. For redundancy levels at or slightly below the level determined to be optimum, the number of usable dice per wafer can be determined with the available redundancy applied with the different redundancy algorithms to select the algorithm that maximizes the number of usable dice.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons having the benefit of this disclosure.

Figure 1:
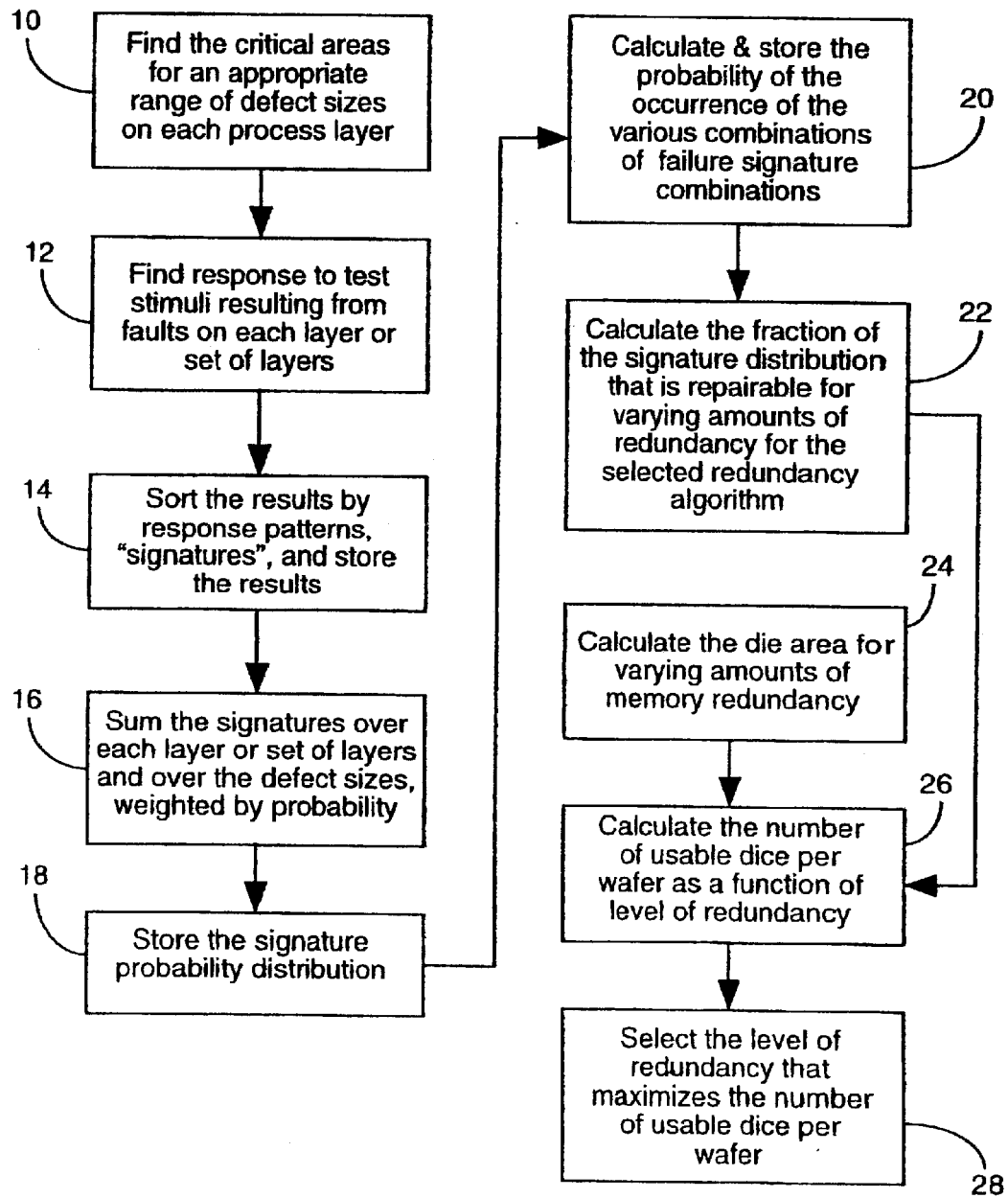
FIG. 1 is a flow chart illustrating a method for determining redundancy level according to the present invention.

FIG. 1 is a flow chart illustrating a method for determining redundancy level. The first task as shown at box 10 is to extract the critical areas for the faults on each layer or set of layers as for several defect sizes chosen to represent those of practical significance. There are several methods of critical area extraction known to those of ordinary skill in the art, such as the Carafe inductive fault extraction software developed at the University of California Santa Cruz.

According to the present invention it must first be determined where and with what probability defects of differing sizes can cause faults to occur on or between process layers. Clearly not all defects can cause faults at all locations. For example, a conducting defect that is smaller than the minimum spacing between two traces on a layer can not bridge the two traces. If the conducting defect is larger than the minimum spacing between the two traces, it may cause a fault, depending on where the defect is located.

Figure 2:
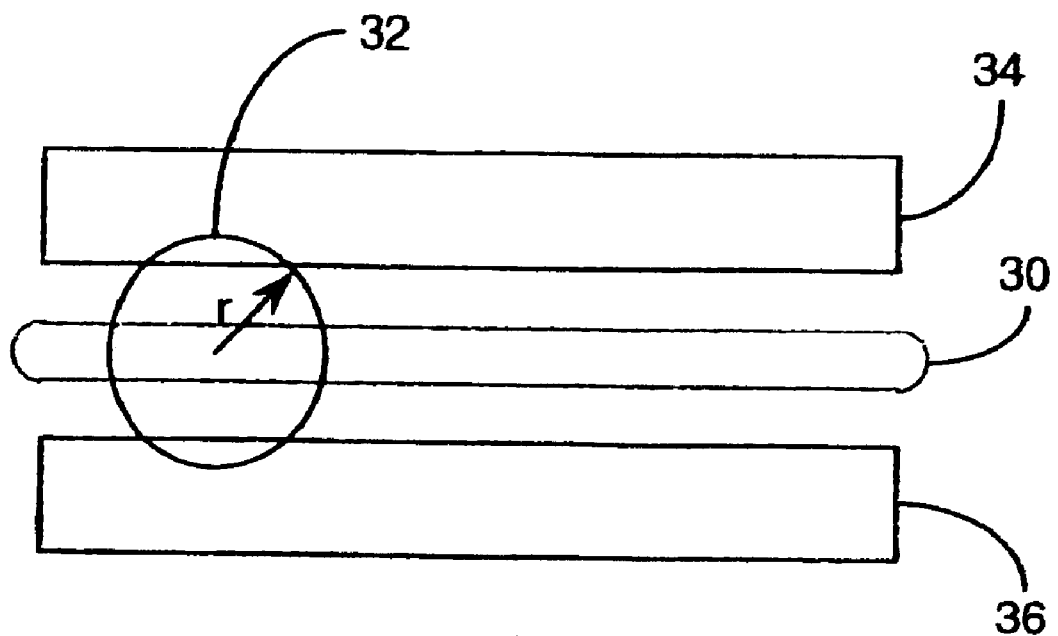
FIG. 2 is a cross sectional view of a portion of an integrated circuit illustrating the concept of critical area.

As is illustrated in FIG. 2, there is a locus of points 30 at which the center of a circular defect 32 of radius r can lie in order to bridge two conducting traces 34 and 36. This locus of points is called the critical area. Although illustrated here for a circular defect, this concept can be generalized. The probability that a defect will cause a fault is proportional to the critical area of the defect for that fault. Thus, calculation of the critical areas for the various possible faults provides a relative measure of the fault probabilities.

The probability of defects occurring on or between particular layers varies with the size of the defects and the layer identity. The defect density has been found by a number of workers to vary as $\lambda^{-\alpha}$ where $\lambda$ is the defect size and $\alpha$ is usually about 3. The relative occurrence of defects on the various process layers depends on the technology and on the particular wafer fabrication plant in which the IC is to be manufactured. This relationship can be determined empirically on the process technology on which the circuit is to be designed.

In the case of a memory, the area and transistor count are both usually dominated by the memory cells, often referred to as the core, and the repeated circuits that connect directly to the cells such as the row decoders and column multiplexers. It is these items that can potentially be repaired with redundant rows and columns so the analysis is restricted to these items. It is often found that the row decoders and column multiplexers contribute such a small fraction of repairable defects that the analysis can be restricted to the core with little loss of accuracy. In this case the analysis can be further restricted to a minimum repeatable block of cells, typically 3×3, 3×4, or 4×4, from which a complete array can be built.

Referring again to FIG. 1, in the next step of the flow chart as shown at box 12, the electrical responses of the faulted memory circuits are determined. There are several methods of determining the electrical responses of circuits well known to those of ordinary skill in the art including using analog circuit simulators such as SPICE or logic simulators such as Verilog. However, these methods involve trade-offs. While the analog simulators are more accurate, they take more time than the logic simulators. If more accuracy were desired, a logic simulator could be used as a first pass and an analog simulator as a follow up.

Figure 3:
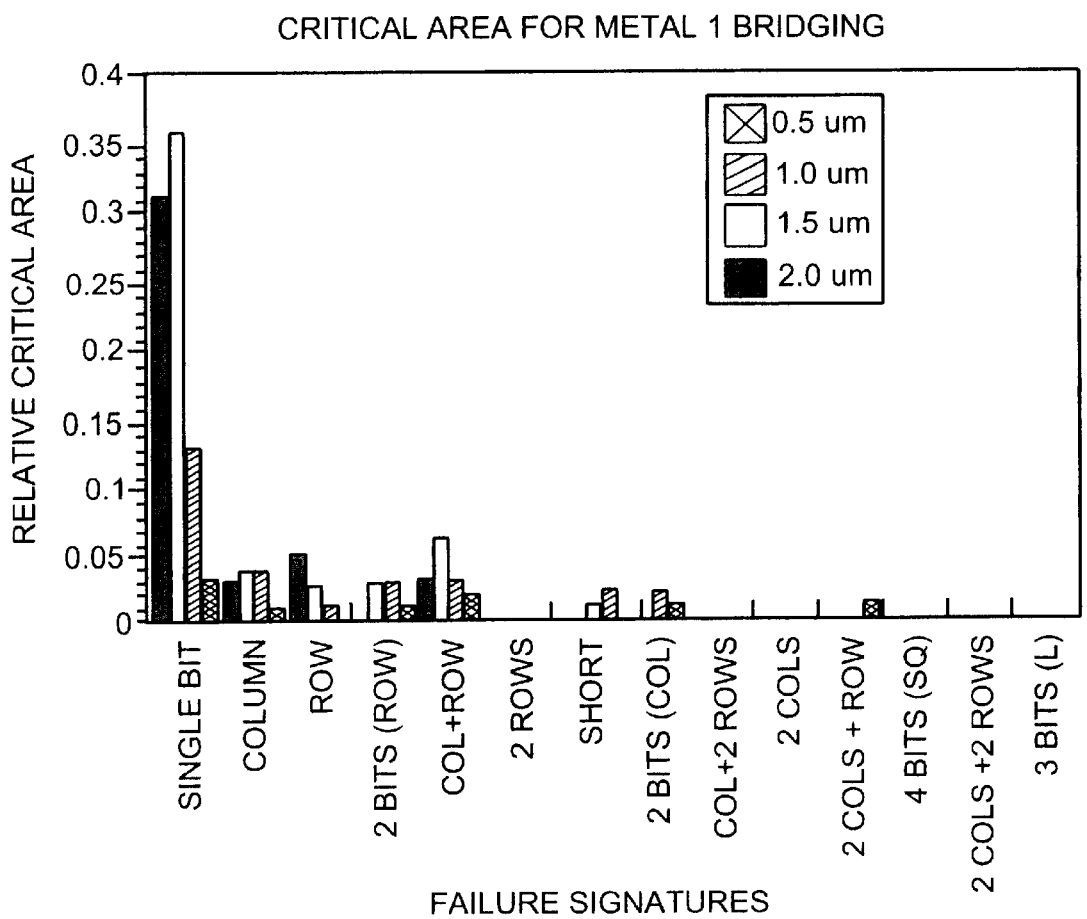
FIG. 3 is a graph showing an example of a signature distribution for a process layer for the case of a memory array.

These electrical responses are sorted at box 14 into signatures for each process layer or layer set and each defect size. For example, all faults on metal 1 of 1 μm size that cause a single bit failure would be grouped together into a single signature. An example of this distribution for metal 1 bridging is shown in the graph of FIG. 3.

Figure 4:
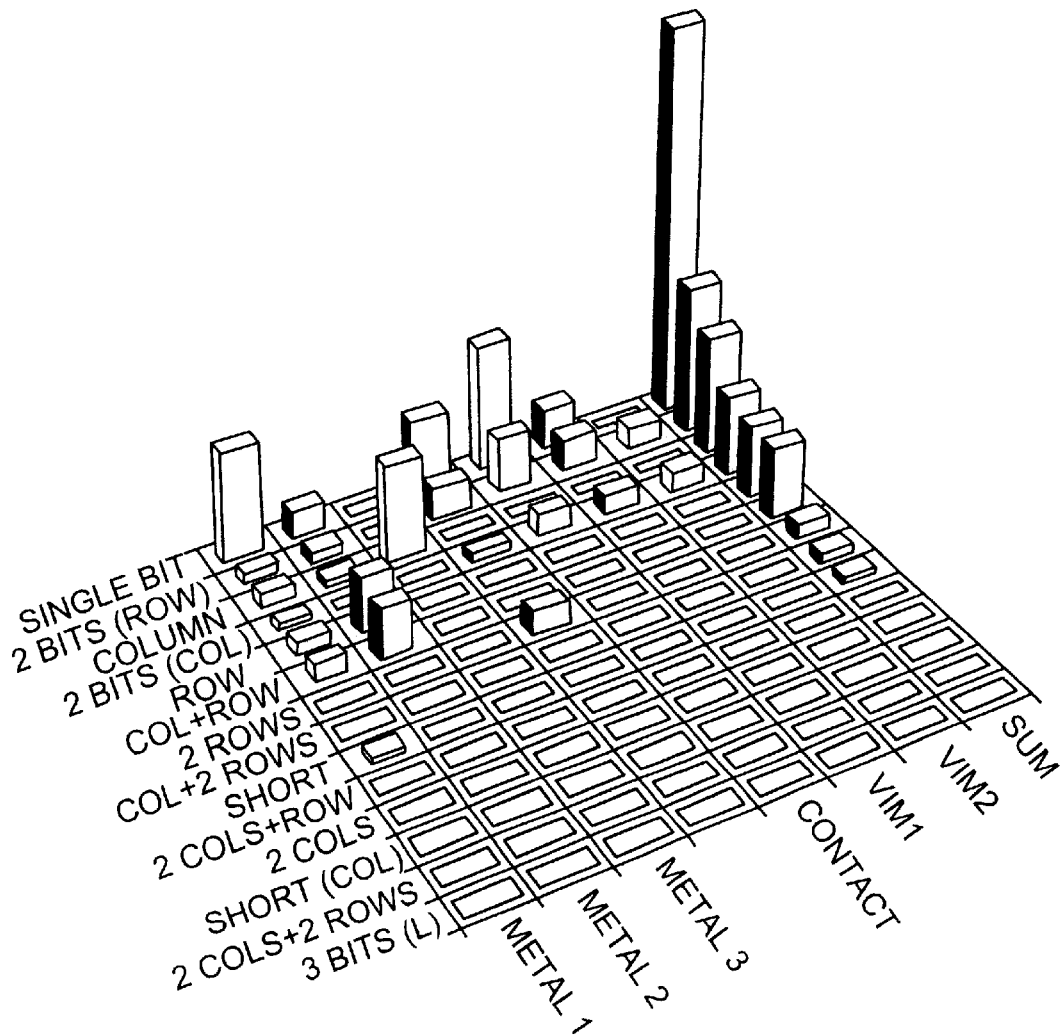
FIG. 4 a graph showing illustrative relative signature frequencies associated with different process layers.

The signatures are then weighted at box 16 by defect size and the probability of a defect occurring on a particular layer. The weighted critical areas of the signatures of like type are then summed. An illustrative way to sum the weighted critical areas of the signatures of like type would be:

$$CA(sig) \propto \sum_{j=1}^{n} \eta_j \cdot \left[ \sum_{i=1}^{m} \left\{ \left(\frac{1}{\lambda_i}\right)^{\alpha} CA_{i,j} \right\} \right]$$

where the $\lambda_i$ are the defect radii, m is the number of radii evaluated, $CA_{ij}$ is the critical area for a particular signature for defects of radius $\lambda_i$ on the $j^{th}$ layer or set of layers, $\alpha$ is the defect size weighting parameter, and $\eta_j$ is the probability for a defect on the $j^{th}$ layer. This yields a probability distribution of signatures. FIG. 4 is an illustrative graph showing the distributions of the relative critical areas of the signatures by layer summed over defect size as well as the distribution of critical areas for all layers. The total relative probability of each signature occurring, which was calculated in box 16, is stored for use in later calculations as indicated in box 18.

There are a number of ways the signature combinations in box 18 can be selected. For example, either the null set containing no defects, all single defect signatures, or all signatures involving two defects may be selected. Alternatively, all signature combinations with a probability of occurrence greater than some value, such as 0.1% may be selected. Many other ways of selecting the signature combinations will readily occur to those of ordinary skill in the art.

Because there can be multiple defects in a single array, there can be combinations of signatures occurring within a memory. The theory of defect distributions has been extensively explored as part of yield modeling over the last several decades. Various authors have advocated the use of Poisson, modified Poisson, or negative binomial distributions. The essential difference between these distributions is the way defect clustering is treated. The Poisson distribution neglects clustering; the negative binomial distribution contains an explicit clustering coefficient; and the modified Poisson distribution contains an approximation to clustering. Using an appropriate distribution, which can be determined by examining the spatial distribution of the defects for clustering, the probabilities of the various signature assemblages are calculated at box 20, including the probabilities for no faults and single signatures.

Before the effectiveness of a given number of redundant rows and columns at repairing the faults that result in a given failure signature can be determined, the methodology for applying the redundant elements must be decided. For example, the methodology might first apply all of the redundant rows, one at a time, until the memory is repaired. Then if all the rows are used without success, the methodology would apply the redundant columns, one at a time, until either the memory is repaired or the repair process fails. As is known by those skilled in the art, the repair methodology, or algorithm, may be selected based on previous experience or it may be a starting point in a search for an optimal algorithm.

The selected redundancy algorithm can be applied to each grouping of signatures from the distribution of groupings of signatures in box 20 and the number of redundant elements required to repair the die found for each grouping of signatures. Once this is done, the fraction of usable dice for each level of redundancy is easily calculated from the probability distribution of signatures as indicated in box 22.

Independently, as indicated in box 24, the die area for each level of redundancy can be estimated, and from this value, the total number of available dice on a wafer can be found for each level of redundancy, as shown in box 26. Obviously, as the redundancy increases, the number of available dice decrease.

Knowing the number of available dice and the fraction of usable dice for each level of redundancy, the net usable dice per wafer can be calculated. Table 1 shows an example of such a calculation for an 8 inch wafer having 1 mm wide scribe lanes and containing a total of 750 die per wafer.

TABLE 1

Number of usable dice per wafer for various levels of row and column redundancy.

| row/col | 0 | 1 | 2 | 3 | 4 | 5 | 6 | 7 | 8 |
|---|---|---|---|---|---|---|---|---|---|
| 0 | 415.6 | 575.8 | 648.7 | 669.0 | 673.6 | 674.0 | 673.7 | 673.3 | 672.9 |
| 1 | 551.6 | 669.7 | 707.7 | 715.0 | 716.0 | 715.7 | 715.3 | 714.9 | 714.5 |
| 2 | 606.3 | 690.5 | 720.8 | 723.3 | 723.4 | 723.0 | 722.6 | 722.2 | 721.7 |
| 3 | 619.4 | 694.1 | 721.4 | 723.1 | 723.2 | 722.8 | 722.3 | 721.9 | 721.5 |
| 4 | 622.0 | 694.3 | 721.0 | 722.6 | 722.7 | 722.3 | 721.8 | 721.4 | 721.0 |
| 5 | 622.0 | 718.8 | 720.5 | 722.1 | 722.1 | 721.7 | 721.3 | 720.9 | 720.4 |
| 6 | 621.6 | 693.3 | 720.0 | 721.5 | 721.6 | 721.2 | 720.7 | 720.3 | 719.9 |
| 7 | 621.2 | 692.8 | 719.4 | 721.0 | 721.0 | 720.6 | 720.2 | 719.8 | 719.3 |
| 8 | 620.7 | 692.3 | 718.9 | 720.5 | 720.5 | 720.1 | 719.7 | 719.2 | 718.8 |

The redundancy is then selected to maximize the number of usable dice per wafer as indicated in box 28. Inspection of Table 1 shows that this number is at a maximum for two redundant rows and four redundant columns. This entry is in bold Table 1. Other practical considerations do come into play. For example, it is very efficient to design decoders for a number of addresses that is a binary power. Had the optimum number of rows been 5 and the shape of the redundancy table been similar, the row redundancy would be chosen to be four, because this yields more usable dice than having eight redundant rows.

Figure 5:
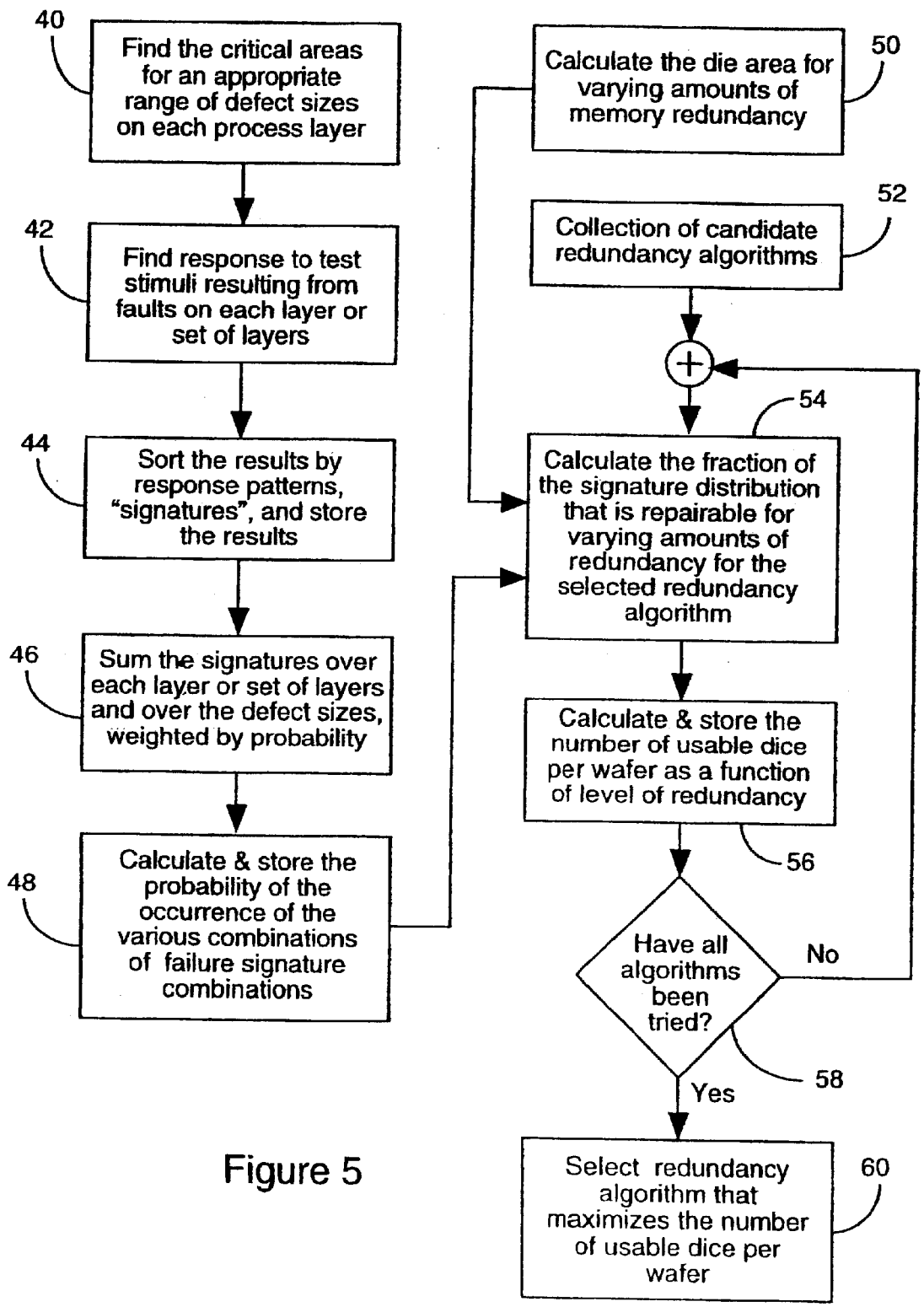
FIG. 5 is a flow chart illustrating a method for determining a redundancy algorithm according to the present invention.

A very similar procedure can be used to select the best redundancy algorithm from a number of candidates as is shown in the flow chart in FIG. 5. The boxes 40 through 46 in the flow chart in FIG. 5 are identical with boxes 10 through 16 of the flow chart in FIG. 1, and boxes 48 and 50 of FIG. 5 are identical with boxes 20 and 22, respectively, of the chart in FIG. 1. After the procedures of boxes 40 through 50, the methodology tries each of a plurality of candidate redundancy algorithms.

Box 52 of FIG. 5 represents a collection of candidate redundancy algorithms. These can be collected from experience, from the literature, or from studying the kinds of signatures and signature groupings that are not being handled efficiently with the existing algorithms and then devising an algorithm that is tuned to handle those signatures not handled efficiently in existing algorithms.

The boxes 54 and 56 in the flow chart of FIG. 5 are similar in nature to boxes 22 and 26, respectively, found in FIG. 1, however, as shown in box 56, the result in FIG. 5 is also stored. Essentially the flow chart of FIG. 5 carries out the calculation of FIG. 1 to find the redundancy level that maximizes the number of usable dice per wafer once for each proposed redundancy algorithm in the collection of candidate redundancy algorithms. When the result in decision diamond 58 indicates that all algorithms in the collection of candidate redundancy algorithms have been tried, then the algorithm that maximizes the yield from among all of the candidates is selected as indicated by box 60.

If it is observed that the optimum redundancy level is insensitive to the algorithm employed, the calculation can be restricted to only calculating the number of usable dice for the redundancy level that maximizes the yield for each proposed algorithm.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for determining the number of redundancy units to employ in a memory integrated circuit comprising:

extracting critical areas for faults on each process layer for a range of defect sizes;

determining signatures of the electrical responses of faulted circuits to the input test stimuli;

determining a statistical frequency distribution of said signatures for a ratio of defect sizes on each said process layer;

determining a statistical frequency distribution of occurrences of selected combinations of said signatures;

determining die area for a selected number of redundancy units;

providing a plurality of candidate redundancy algorithms;

determining and storing the number of usable die per wafer from said plurality of candidate redundancy algorithms, said signature distribution and said die area; and selecting a redundancy algorithm that maximizes said number of usable die per wafer.

2. The method of claim 1 in which the redundancy units include rows.

3. The method of claim 1 in which the redundancy units include columns.

4. The method of claim 1 in which the redundancy units include rows and columns.

5. A method for determining the number of redundancy units to employ in a memory integrated circuit comprising:

extracting critical areas for faults on each process layer for a range of defect sizes;

determining signatures of the electrical responses of faulted circuits to the input test stimuli;

determining a statistical frequency distribution of said signatures for a ratio of defect sizes on each said process layer;

determining a statistical frequency distribution of occurrences of selected combinations of said signatures;

determining a ratio of said signature distribution for different numbers of redundancy units;

determining die area for each of said different numbers of redundancy units;

providing a plurality of candidate redundancy algorithms;

determining the number of usable die per wafer from said plurality of candidate redundancy algorithms, said signature distribution and said die area;

storing said number of usable die per wafer as a function of level of redundancy; and selecting a redundancy algorithm that maximizes said number of usable die per wafer.

6. The method of claim 5 in which the redundancy units include rows.

7. The method of claim 5, in which the redundancy units include columns.

8. The method of claim 5, in which the redundancy units include rows and columns.

* * * * *